(12) United States Patent
Riani et al.

(10) Patent No.: US 11,038,538 B2
(45) Date of Patent: *Jun. 15, 2021

(54) MAXIMUM LIKELIHOOD ERROR DETECTION FOR DECISION FEEDBACK EQUALIZERS WITH PAM MODULATION

(71) Applicant: INPHI CORPORATION, Santa Clara, CA (US)

(72) Inventors: Jamal Riani, Fremont, CA (US); Farshid Rafiee Rad, Los Gatos, CA (US); Benjamin P. Smith, Ottawa (CA); Yu Liao, Longmont, CO (US); Sudeep Bhoja, San Jose, CA (US)

(73) Assignee: INPHI CORPORATION, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/827,355

(22) Filed: Mar. 23, 2020

(65) Prior Publication Data

US 2020/0220563 A1   Jul. 9, 2020

Related U.S. Application Data

(63) Continuation of application No. 16/515,895, filed on Jul. 18, 2019, now Pat. No. 10,637,512, which is a continuation of application No. 15/995,036, filed on May 31, 2018, now Pat. No. 10,404,289.

(51) Int. Cl.
*H04L 1/00* (2006.01)
*H03M 13/39* (2006.01)

(52) U.S. Cl.
CPC ... *H03M 13/3916* (2013.01); *H03M 13/3911* (2013.01); *H04L 1/0058* (2013.01); *H04L 1/0054* (2013.01)

(58) Field of Classification Search
CPC ......... H03M 13/3916; H03M 13/3911; H03M 13/09; H03M 13/6331; H04L 1/0058; H04L 1/0054; H04L 25/03171; H04L 25/03146; H04L 1/0041; H04L 1/005
See application file for complete search history.

(56) References Cited

U.S. PATENT DOCUMENTS

| 10,404,289 B1* | 9/2019 | Riani ............... H03M 13/3911 |
| 10,637,512 B2* | 4/2020 | Riani ................ H04L 1/0058 |
| 2002/0037059 A1* | 3/2002 | Heegard ............ H04L 1/0047 375/341 |
| 2015/0349991 A1* | 12/2015 | Iyer ................... H04L 7/0062 375/233 |

* cited by examiner

*Primary Examiner* — Kenneth T Lam
(74) *Attorney, Agent, or Firm* — Richard T. Ogawa; Ogawa P.C.

(57) ABSTRACT

The present invention is directed to data communication. More specifically, an embodiment of the present invention provides an error correction system. Input data signals are processed by a feedforward equalization module and a decision feedback back equalization module. Decisions generated by the decision feedback equalization module are processed by an error detection module, which determines error events associated with the decisions. The error detection module implements a reduced state trellis path. There are other embodiments as well.

8 Claims, 8 Drawing Sheets

MAXIMUM LIKELIHOOD ERROR DETECTION FOR DECISION FEEDBACK EQUALIZERS WITH PAM MODULATION

CROSS-REFERENCES TO RELATED APPLICATIONS

This application is a continuation of and claims priority to U.S. patent application Ser. No. 16/515,895, filed on Jul. 18, 2019, which is a continuation of U.S. patent application Ser. No. 15/995,036, (now U.S. Pat. No. 10,404,289, issued on Sep. 3, 2019) filed on May 31, 2018, commonly assigned and incorporated by reference herein for all purposes.

BACKGROUND OF THE INVENTION

The present invention is directed to data communication.

Over the last few decades, the use of communication networks has exploded. In the early days of the Internet, popular applications were limited to emails, bulletin board, and mostly informational and text-based web page surfing, and the amount of data transferred was relatively small. Today, the Internet and mobile applications demand a huge amount of bandwidth for transferring photo, video, music, and other multimedia files. For example, a social network like Facebook processes more than 500 TB of data daily. With such high demands on data storage and data transfer, existing data communication systems need to be improved to address these needs.

Error detection and correction is an important aspect of data communication. For example, feedforward equalization and decision feedback equalization are useful techniques, and various conventional communication systems used them. Unfortunately, conventional systems and techniques have been inadequate. Therefore, new and improved error correction techniques are desired.

BRIEF SUMMARY OF THE INVENTION

The present invention is directed to data communication. More specifically, an embodiment of the present invention provides an error correction system. Input data signals are processed by a feedforward equalization module and a decision feedback equalization module. Decisions generated by the decision feedback equalization module are processed by an error detection module, which determines error events associated with the decisions. The error detection module implements a reduced state trellis path. There are other embodiments as well.

According to an embodiment, the present invention provides an error detection device, which includes an input terminal for receiving a data signal. The device further includes a feedforward equalization (FFE) module configured to equalize the data signal and generate an equalized data signal. The device also includes a first decision feedback equalization (DFE) module configured to remove at least intersymbol interference (ISI) noises from the equalized data signal and generate DFE decisions. The device additionally includes an error detection module configured to detect error events associated with the DFE decisions by performing maximum likelihood detections. The error detection module is configured to store signs associated with an input error state and generate an output error state by flipping the signs. The FFE module amplifies an amplitude of the data signal by a predetermined amount. The error detection module removes burst errors associated with the DFE decisions. The device further comprises a reflection cancelation module coupled to the first DFE module for removing reflection noises. In various implementations, the data signal comprises PAM4 data. The device may further include a slicer module for processing the equalized data signal. For example, the error events are associated with Nyquist error events (i.e., alternating-sign error events).

According to another embodiment, the present invention provides an input terminal for receiving a data signal. The device includes a feedforward equalization (FFE) module configured to equalize the data signal and generate an equalized data signal. The device also includes a decision feedback equalization (DFE) module configured to remove intersymbol interference (ISI) noises from the equalized data signal and generate DFE decisions. The device additionally includes an error generator module configured to generate an error signal by comparing the equalized data and the DFE decisions further includes an error detection module configured to detect error by analyzing the DFE decisions and the error signal. The error detection module is configured to store signs associated with an input error state and generate an output error state by flipping the signs. In a specific embodiment, the error detection module comprises a maximum likelihood sequence detection module. In an embodiment, the error generator subtracts DFE decisions from the equalized data signal. In an implementation, the device additionally includes a non-linear cancelation module. In an embodiment, the error detection module implements a reduced-state trellis path, where the reduced-state trellis path comprises an input zero state and the input error state, and the reduced-state trellis path also includes an output zero state and the output error state.

According to yet another embodiment, the present invention provides a communication device that includes an input terminal for receiving a data signal. The device also includes a feedforward equalization (FFE) module configured to equalize the data signal and generate an equalized data signal. The device additionally includes a decision feedback equalization (DFE) module configured to remove intersymbol interference (ISI) noises from the equalized data signal and generate DFE decisions. The device further includes an error detection module configured to detect error events associated with the DFE decisions by performing maximum likelihood detections. The error detection module is configured to store signs associated with an input error state and generate an output error state by flipping the signs. The device additionally includes a forward error correction (FEC) decoder for decoding the equalized data signal using at least the DFE decision. In a specific embodiment, the FFE module amplifies an amplitude of the data signal by a predetermined amount. In certain embodiments, the device further includes a de-mapping module coupled to the FEC decoder. In a specific embodiment, the device also includes a slicer module coupled to the FFE module. The device may also include a control module coupled to the DFE module.

It is to be appreciated that embodiments of the present invention provide many advantages over conventional techniques. Among other things, the MLSD can effectively reduce errors in DFE decisions, thereby improving system performance. In various embodiments, MLSD techniques take advantage of prior knowledge in DFE decisions and implements trellis path with a reduced number of states. For example, embodiments of the present invention provide an error-event MLSD (ee-MLSD). As an example, ee-MLSD is implemented as a post-processing unit cleaning DFE errors. Compared to conventional full-fledged MSLDs, ee-MLSDs implemented with reduced-states can provide substantially the same accuracy, but at a much lowered costs.

Embodiments of the present invention can be implemented in conjunction with existing systems and processes. For example, an error correction module can be implemented using existing hardware modules, which can be manufactured using conventional equipment and techniques. Additionally, different detection and equalization schemes such as decision feedback equalization, reflection cancelation, slicer, maximum likelihood detection, and/or others—can be implemented to complement the subsequent error correction system to provide a high level of flexibility in trading off power for performance. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The present invention is directed to data communication. More specifically, an embodiment of the present invention provides an error correction system. Input data signals are processed by a feedforward equalization module and a decision feedback back equalization module. Decisions generated by the decision feedback equalization module are processed by an error detection module, which determines error events associated with the decisions. The error detection module implements a reduced state trellis path. There are other embodiments as well.

DETAILED DESCRIPTION OF THE INVENTION

Figure 1A:
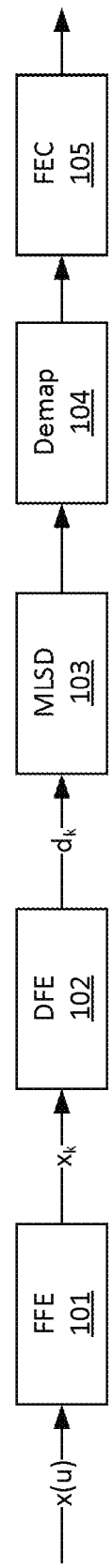
FIG. 1A is a simplified block diagram illustrating an error correction system according to embodiments of the present invention.

The present invention is directed to data communication. More specifically, an embodiment of the present invention provides an error correction system. Input data signals are processed by a feedforward equalization module and a decision feedback back equalization module. Decisions generated by the decision feedback equalization module is processed by an error detection module, which determines error events associated with the decisions. The error detection module implements a reduced state trellis path. There are other embodiments as well.

As mentioned above, error correction is an important aspect of data communication and processing. For example, as data are transmitted through a communication network, various types of interferences and noises may cause errors in data transmission, and the receiving entity often needs to remove interferences and noises before performing error correction. For different types of interferences and noises, different techniques are used. For example, feed-forward equalization (FFE) boosts amplitudes of symbols surrounding transitions (e.g., from "0" to "1" or vice versa) and facilitates data processing. For example, by boosting signal amplitude, the SNR can be improved. Decision-feedback equalization (DFE) is effective in removing intersymbol interference (ISI) type of noises and errors, but it is often vulnerable to burst errors. In various embodiments, the present invention provides maximum likelihood sequence detection (MLSD) techniques that are particularly useful against DFE burst errors. As described in further details before, embodiments of the present invention provide error correction techniques with FFE, DFE, and MLSD blocks for signal processing.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1A is a simplified block diagram illustrating an error correction system according to embodiments of the present invention. This diagram is merely an example, which should not unduly limit the scope of the claims. One of ordinary skill in the art would recognize many variations, alternatives, and modifications. For example, the error correction system illustrated in FIG. 1A is a portion of a communication system that is responsible for processing received signals. For example, the communication system may use pulse-amplitude modulation (PAM) techniques for data transmission. Received signal x(u) is first processed at FFE block 101. For example, FFE block 101 boosts the amplitude of incoming signals (e.g., data symbols in a PAM based communication system). For example, by improving the amplitude of received signal, FFE block 101 can effectively improve signal-noise ratio. At the same time, it is important for the FFE block 101 to not boost the incoming signals too much. If FFE block 101 applies too much equalization, it may undesirably boost the amplitude of unwanted noise. For example, the amount of amplification by the FFE block 101 may be predetermined and/or based on an assessment of the data signal x(u).

The output of FFE block 101 is the equalized signal $x_k$ as shown in FIG. 1A. DFE block 102 removes ISI noise from the equalized signal $x_k$. As described below, DFE block 102 (or in conjunction with additional DFE blocks) can also provide preliminary decisions for control loops, reflection cancellation module, and/or other functions. Unfortunately, DFE block 102 is not immune to errors. One type of error for which the DFE block 102 is particularly susceptible to is burst errors, where error signal would bounce between two incorrect errors. For example, as DFE corrects an incorrect value of "+1" by subtracting "+1" from the output, the error state may change to "−1" due to over correction, and DFE output would oscillate between "+1" and "−1" before settling down (e.g., overcorrection in the subsequent turn would go on for a while before burst errors are removed). Sometimes, this type of error is also referred to as "bouncing" errors, as the error value would bounce back and forth. Depending on the signal quality and the implementation of DFE, the burst error could take a while to remove before dying out. For example, DFE response can be characterized by 1+αD, with α≥0. Error events (e.g., burst errors) attributed to the DFE are typically Nyquist errors of type "+", "+−", "+−+", etc. The output of DFE block 102 is signal $d_k$, which is processed by ee-MLSD block 103.

The ee-MLSD block 103, among other features, is particularly suitable for removing burst errors or error events attributed to DFE block 102. For example, MSLD block 103 specifically targets the structure of DFE error. In various implementations, ee-MLSD block 103 uses trellis search techniques, where the trellis path includes two levels or two states. The traversal of trellis search is based on a maximum likelihood detection calculation. In a specific implementation, linear response 1+αD with PAM4 levels ±3 and ±1, a reduced state (e.g., two states) trellis path for ee-MLSD is used. After processing, ee-MLSD block 103 provides data symbols for de-mapping at block 104, and the de-mapped data are then processed by FEC block 105 for error correction. It is to be understand that the FEC 105 can be implemented in various ways.

Figure 1B:
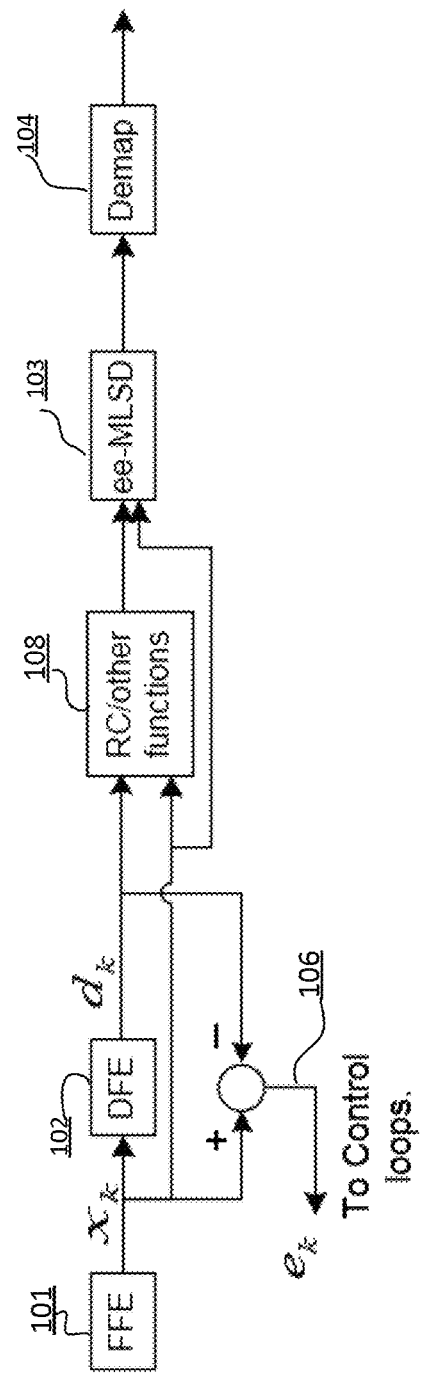
FIG. 1B is a simplified diagram illustrating a communication system according to embodiments of the present invention.

FIG. 1B is a simplified diagram illustrating a communication system according to embodiments of the present invention. This diagram is merely an example, which should not unduly limit the scope of the claims. One of ordinary skill in the art would recognize many variations, alternatives, and modifications. Input data signal is first processed by FFE block 101, which provides signal equalization to optimize signal amplitude. The output of FFE block 101 is denoted as $x_k$, which is processed by DFE block 102. The output of DFE block 102 is used as a feedback loop at node 106. For example, output signal $e_k$ at the node 106 is provided to other digital signal processing (DSP) functions, such as control loops or others. The output of DFE block 102 is also used by reflection cancelation (RC) block 108. For example, RC block 108 removes undesirable reflection that is common in high speed communication systems. Additional signal processing may be performed by DFE block 110. The ee-MLSD block 103, as explained above, specifically detects error events associated with DFE block 102. For various legacy processing, block 111 as shown provides additional DSP features.

After equalization and error correction, data are de-mapped by de-map blocks 104 and 112. For example, the de-mapping process may be associated with PAM communication data and/or other data models. The forward error correction (FEC) decoder module 105 then performs error correction on the da-mapped data. Decoder module 105 as shown in FIG. 1B includes various processing blocks, but it is understood that other types of decoders or decoders with different configurations can be used as well. It is to be appreciated that embodiments of the present invention provide a high level of flexibility, and the error detection and correction techniques can be implemented into different communication systems.

Figure 1C:
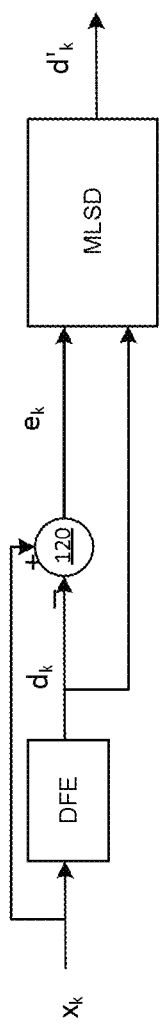
FIG. 1C is a simplified diagram illustrating an error detection module according to embodiments of the present invention.

FIG. 1C is a simplified diagram illustrating an error detection module according to embodiments of the present invention. This diagram is merely an example, which should not unduly limit the scope of the claims. One of ordinary skill in the art would recognize many variations, alternatives, and modifications. Equalized signal (e.g., processed by a FFE) $x_k$ is first processed by the DFE block to detect ISI errors. Preliminary decisions generate by the DFE block is denoted $d_k$, and it is used by the error generator block 120, which outputs an error signal denoted $e_k$. For example, the error generator block 120 determines the error signal by subtracting DFE decisions from the equalized signal received from the FFE. The ee-MLSD block detects event errors based on $d_k$ and $e_k$ as shown. After removing event errors associated with the DFE block, the ee-MLSD block output $d_k$. Depending on the implementation, MLSD processes can be expensive both in processing power and time. It is thus to be appreciated that embodiments of the present invention provide reduced state trellis path implementation of MLSD that is efficient in terms of processing power and time.

Figure 1D:
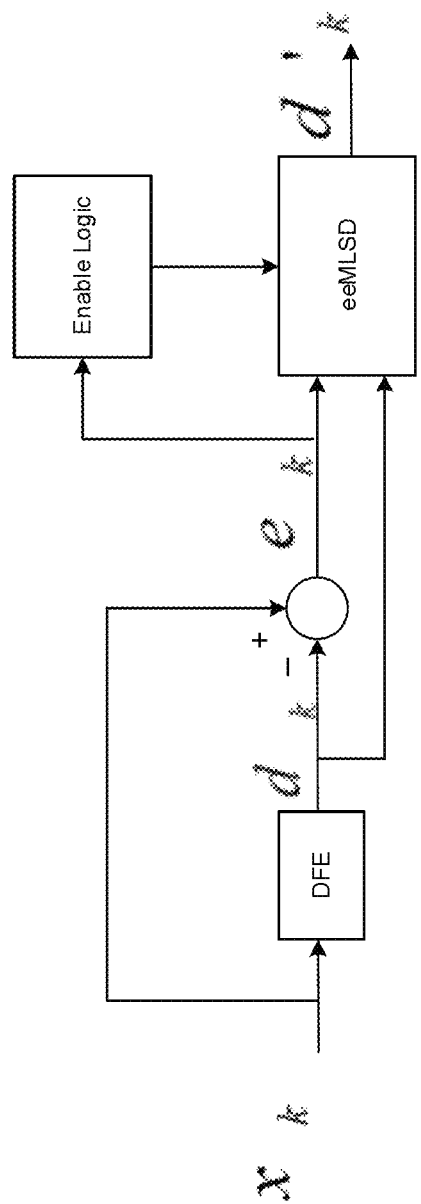
FIG. 1D is a simplified diagram illustrating an error detection module with an enable logic according to embodiments of the present invention.

FIG. 1D is a simplified diagram illustrating an error detection module with an enable logic according to embodiments of the present invention. This diagram is merely an example, which should not unduly limit the scope of the claims. One of ordinary skill in the art would recognize many variations, alternatives, and modifications. As shown in FIG. 1D, the ee-MLSD block is controlled by the enable logic block. For example, the enable logic block may determine (e.g., based on the amount of error $e_k$) that ee-MLSD processing is not needed, and the ee-MLSD block could then just let the data pass through. In certain embodiments, the enable logic determines whether to enable the ee-MLSD block based on initial quality of the data signal. For example, the enable logic block determines whether to enable the MLSD based on the quality of a data block. In certain embodiments, the enable logic provides an enable signal accompanying each data block, and the dynamic enable signal based on the quality of each data block can save ee-MLSD power.

As explained above, MSLD removes errors events attributed to DFE decisions. The output of the FFE block is denoted $x_k$. The output of DFE (preliminary DFE decisions)

is denoted as $d_k$. The error signal is denoted $e_k$. For the purpose of discussion, the DSP parallel factor is ignored (i.e., time index k denotes UI index). As illustrated in FIG. 1B, many error correction systems utilize DFE modules and error generator blocks. DFE and error generator block provide control information for the DSP control loops and preliminary inputs to the RC block.

For the purpose of explanation, the target response (linear) is expressed as $g(D)=1+\alpha D$, and the DFE error events are expressed as $\epsilon_k \subseteq \{0,\pm1\}$. The DFE decision can thus be defined in Equation 1 below:

$$d_k = d_k^{ideal} - 2\epsilon_k \qquad \text{Equation 1:}$$

Where $d_{ideal}$ are the transmitted PAM (e.g., PAM4) symbols.

To explain the operation of DFE and MLSD, the error signal $e_k$ is expressed by Equation 2 below:

$$e_k = x_k - (g*d)_k = 2(g*\epsilon)_k + n_k, \qquad \text{Equation 2:}$$

where $n_k$ is the FFE output total/equivalent noise.

From the above equations, it can be proven that for a sequence $x_k$ and DFE PAM4 decision $d_k$, the maximum likelihood sequence detection (assuming $n_k$ is additive white Gaussian noise, or AWGN) is equivalent to finding the error sequence $\epsilon_k$ that minimizes as expressed in Equation 3:

$$\min_{\epsilon_k | d_k + 2\epsilon_k \in PAM4} \sum_k \left(\frac{e_k}{2} - (g*\epsilon)_k\right)^2 \qquad \text{Equation 3}$$

In Equation 3, the minimization is conditioned on $d_k + 2\epsilon_k \in PAM4$ as not all error events are valid given the DFE decision $d_k$. For example, if $d_k=3$, then $\epsilon_k$ can only be either 0 (DFE made no error) or −1 (in which case the decision should be been +1 instead of 3). It is to be understood that while Equation 3 above uses PAM4 modulation as an example, the ee-MLSD techniques can be used in other PAM-n implementations, where n is an even integer.

For ease of notation, error signals are expressed as $y_k = e_k/2$. It is to be appreciated that embodiments of the present invention simplify the error minimization through exploiting prior knowledge of DFE event error. More specifically, DFE errors events ($\epsilon_k$) for $0 \leq \alpha \leq 1$ are Nyquist events as "+", "+−", "+−+", "+−+−", etc., and signed flipped versions thereof. With this knowledge, Equation 3 can be simplified to Equation 4 below:

$$\min_{\epsilon_k \in \text{Trellis } T_0 | d_k + 2\epsilon_k \in PAM4} \sum_k (y_k - (g*\epsilon)_k)^2 \qquad \text{Equation 4}$$

Figure 2:
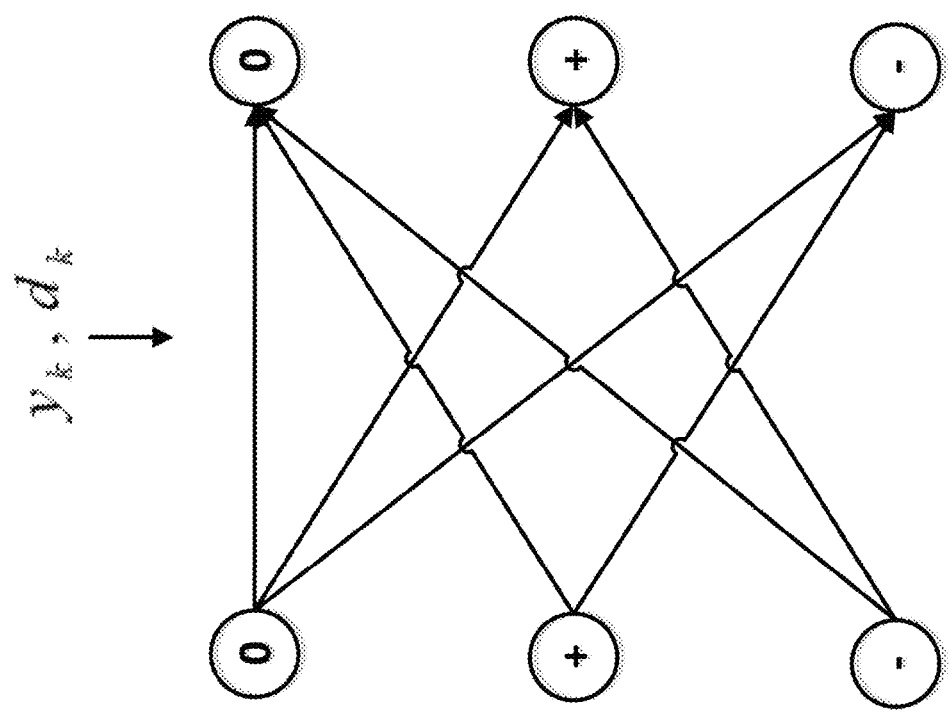
FIG. 2 is a simplified state diagram illustrating a trellis state diagram according to embodiments of the present invention.

The trellis $T_0$ in Equation 4 is illustrated in FIG. 2. FIG. 2 is a simplified state diagram illustrating a trellis state diagram according to embodiments of the present invention. This diagram is merely an example, which should not unduly limit the scope of the claims. One of ordinary skill in the art would recognize many variations, alternatives, and modifications. In searching the trellis path, the states of "0", "+", and "−" at the left side are the input states, and the output states "0", "+", and "−" are at the right side. The principle of the trellis $T_0$ is expressed and explained in Equation 4. That is, the rule of traversing the trellis path $T_0$ is determined using Equation 4, which is an implementation of a maximum likelihood detection function. However, it is to be noted that having so many states as shown FIG. 2 can be computationally expensive to implement.

To simplify the search, it is observed that trellis paths emanating from state "0" and ending at states "+" and "−" are 6 dB away from each other in terms of Euclidean distance once one of the paths corresponds to the correct path (i.e., corresponding to the DFE error event). As the best possible MLSD SNR gain is less than 3 dB (e.g. for $\alpha=1$), one can simply fold the two states "+" and "−" under one state "E" without loss of performance.

Figure 3:
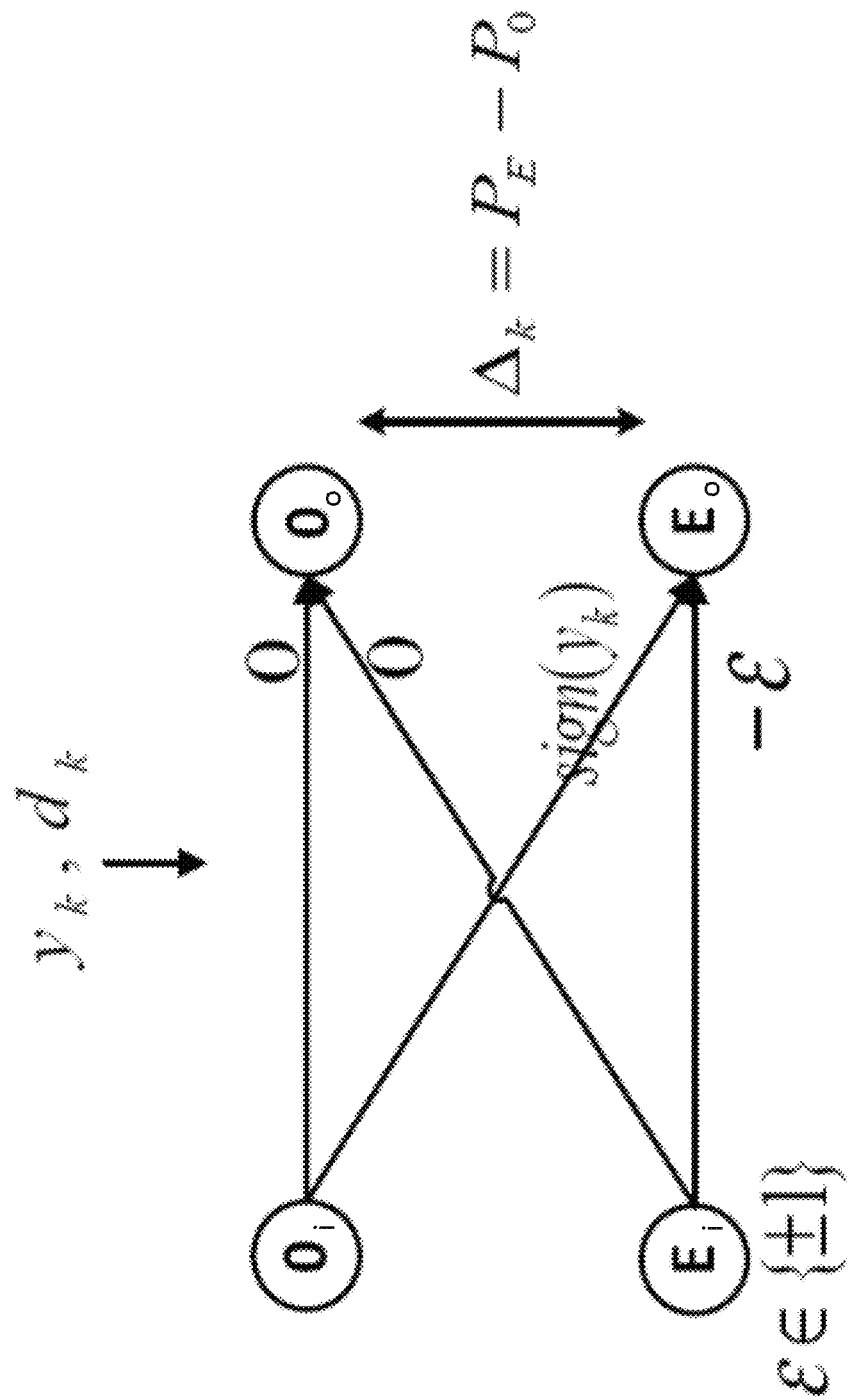
FIG. 3 is a simplified state diagram illustrating a simplified trellis $T_1$ state diagram according to embodiments of the present invention.

FIG. 3 is a simplified state diagram illustrating a simplified trellis $T_1$ state diagram according to embodiments of the present invention. This diagram is merely an example, which should not unduly limit the scope of the claims. One of ordinary skill in the art would recognize many variations, alternatives, and modifications. The new trellis for DFE error events is trellis $T_1$ illustrated in FIG. 3. The states "$E_i$" and "$E_o$" has an intrinsic variable c storing the sign of the error event at time index k. The transition from state $0_i$ and state $E_O$ provides the error event sign as sign of $y_k$. By having only two input states and two output states, the trellis path $T_1$ is reduced from a total of six states (as in trellis path $T_O$) to four states.

For example, the simplification of state graph can be proven by noting that the expression min $\epsilon_k \in \{\pm1\}$ $(y_k - \epsilon)^2$ is given by $\epsilon_k = \text{sign}(y_k)$. The transition from state $E_i$ to state $E_o$ yields a sign flip of the error event $\epsilon$.

To simplify the search process, the search process takes advantage of the Ferguson algorithm. More specifically, instead of using keeping/storing the path metrics for each state (i.e., "0"/"E"), the error detection mechanism stores and updates the difference $\Delta$ between the path metrics of each state. For example, as shown in FIG. 3, the distance between state $0_o$ and state E0 is expressed by Equation 5 below:

$$\Delta_k = P_E - P_0 \qquad \text{Equation 5:}$$

It is to be appreciated that it is advantageous to use trellis with a reduced number of states as illustrated FIG. 3. By having the reduced number of states, the error detection mechanism eliminates the need for squaring of the input signal-branch level to compute the branch metrics. Additionally, by reducing the number of states, the critical timing path is reduced, where the add-compare-select (ACS) bottleneck is changed "add+compare+select" to mostly just "add+select", as the compare operation collapses to the sign of an updated value of the difference $\Delta$. Furthermore, path metric normalization processes can be eliminated through the use of limited fixed point representation of path metrics. There are other benefits as well, such as lowered power consumption.

Figure 4:
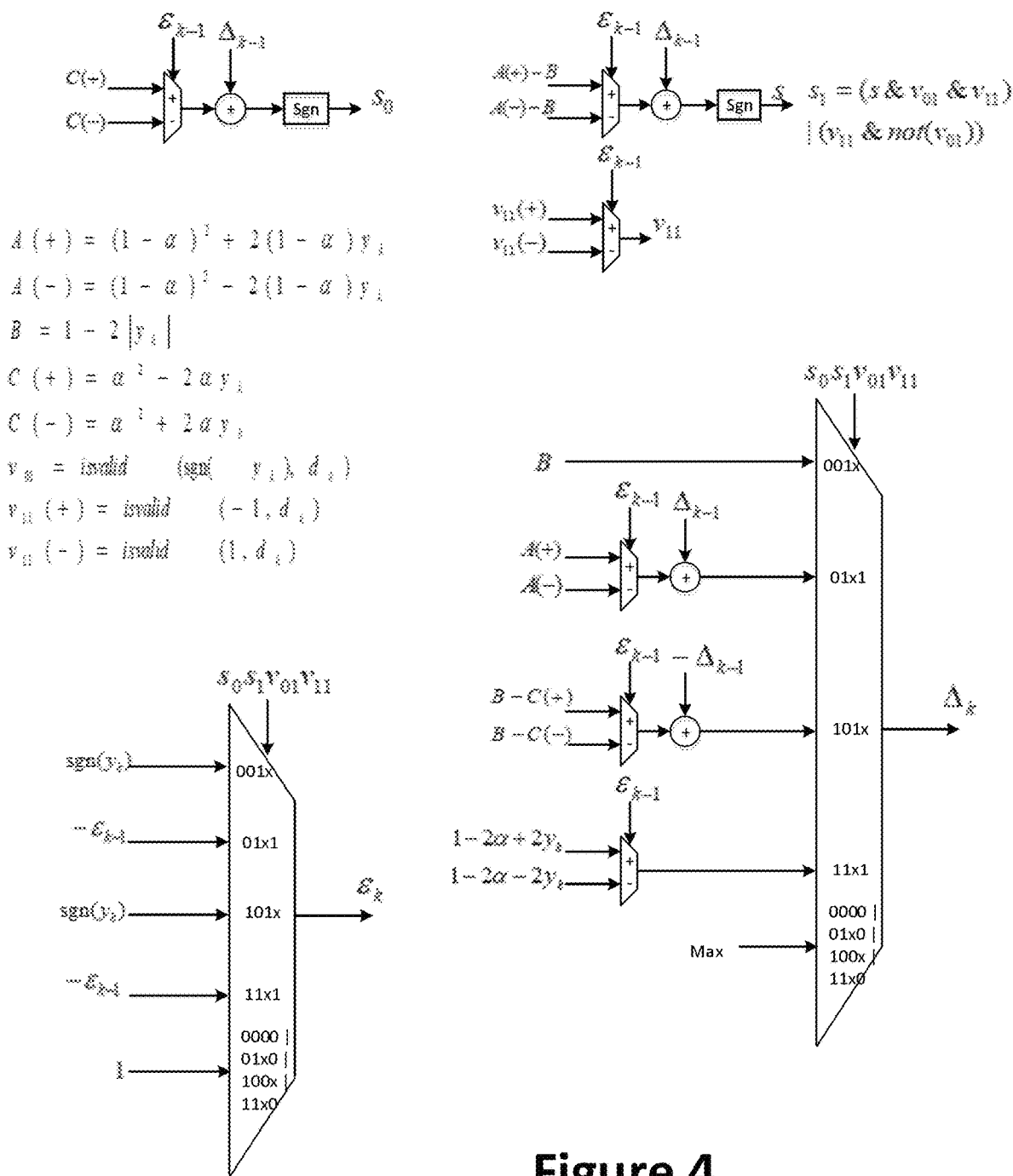
FIG. 4 is a simplified diagram illustrating an ee-MLSD according to an embodiment of the present invention.

FIG. 4 is a simplified diagram illustrating an ee-MLSD according to an embodiment of the present invention. This diagram is merely an example, which should not unduly limit the scope of the claims. One of ordinary skill in the art would recognize many variations, alternatives, and modifications. More specifically, FIG. 4 shows the branch metric calculation and add-select (AS) unit for a simplified ML error trellis search algorithm. It is to be appreciated that other implementations are possible as well. As to be noted in FIG. 4, most functions are simply "add" functions (e.g., "A+B") and "select" functions (e.g., between "C+" and "C−"). For example, by using AS unit instead of add-compare-select (ACS) unit, both hardware implementation and the computation process are simplified. As an example, the ee-MLSD in FIG. 4 is specifically implemented for PAM4 data communication.

It is to be appreciated that error correction systems and methods thereof provide many advantages over existing systems. The input signal to this simplified error event detector is simply $y_k=e_k/2$, which has reduced number of bits in its fixed-point representation compared to a conventional MLSD input. In a communication system, implementations according to embodiments of the present invention can reduce the size of baseboard management controller (BMC) and the size of the input buffering required by block-based VD. By reducing the complexity of trellis search (e.g., from FIG. 2 to FIG. 3), the number of branch metrics and complexity thereof can be significantly reduced compared to that of an MLSD with full states. To perform the trellis search, there is no multiplication required to calculate the branch metrics, except for one $\alpha*y_k$ per UI.

Figure 5:
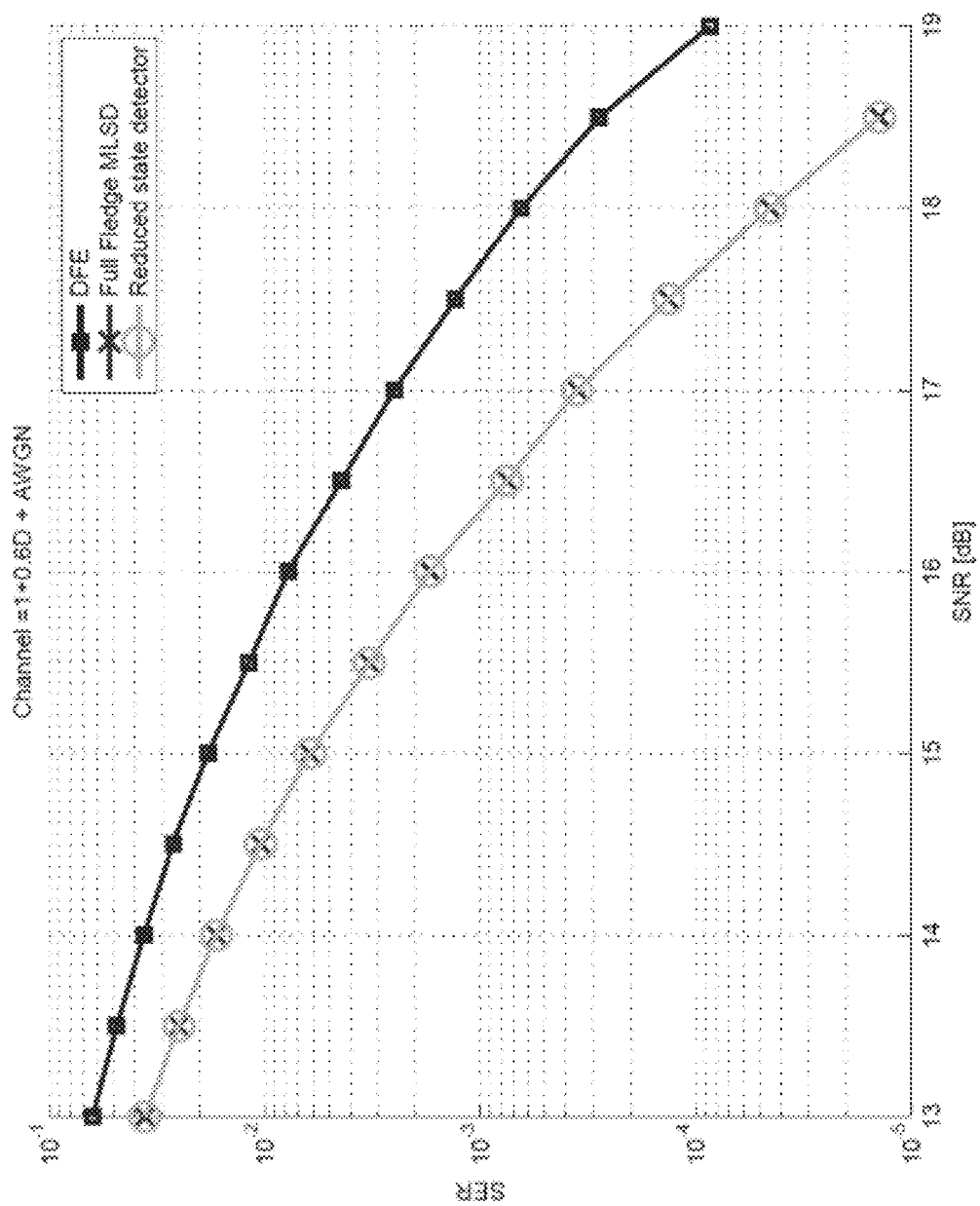
FIG. 5 is a graph illustrating simulation results comparing performance of ee-MLSD devices according to embodiments of the present invention.

FIG. 5 is a graph illustrating simulation results comparing performance of MLSD devices according to embodiments of the present invention. This diagram is merely an example, which should not unduly limit the scope of the claims. One of ordinary skill in the art would recognize many variations, alternatives, and modifications. The graph shows symbol error rate (SER) on the y-axis in relation to the signal-to-noise ratio (SNR) on the x-axis, wherein the system is configured at 1+0.6D channel with AWGN. DFE plot 501 is provided as a reference. As can be seen in FIG. 5, the SER measurements at different SNR levels for both a conventional full fledge MLSD and ee-MLSD (e.g., illustrated in FIG. 3) are almost the same, which means that the ee-MLSD can provide performance very close to (if not identical) the full fledge MLSD.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An error detection device comprising:
   a decision feedback equalizer (DFE) configured to remove intersymbol interference (ISI) noise from a data signal and generate DFE decisions;
   an error detector configured to detect error events associated with a sequence of data of the DFE decisions by performing maximum likelihood detections, the error detector being configured to generate an output error states; and
   an enable logic configured to generate a control signal for the error detector based on a quality of the data signal.

2. The device of claim 1 further comprising a feedforward equalizer (FFE) configured to equalize the data signal.

3. The device of claim 1 wherein the error detector removes burst errors associated with the DFE decisions.

4. The device of claim 1 wherein the DFE comprises a reduced-state trellis path that comprises an intrinsic variable for storing signs of errors.

5. The device of claim 1 wherein the error detector is configured to store signs associated with an input error state and generate an output error states by flipping the signs.

6. The device of claim 1 further comprising a de-mapping module for processing the data signal.

7. The device of claim 1 wherein the DFE comprises a reduced-state trellis path that comprises two input states and two output states.

8. The device of claim 1 wherein the error detector is configured to flip signs using a reduced-state trellis path.

* * * * *